US011088668B2

(12) United States Patent
Kovac et al.

(10) Patent No.: US 11,088,668 B2
(45) Date of Patent: Aug. 10, 2021

(54) LNA WITH CONTROLLED PHASE BYPASS

(71) Applicant: pSemi Corporation, San Diego, CA (US)

(72) Inventors: David Kovac, Arlington Heights, IL (US); Joseph Golat, Crystal Lake, IL (US)

(73) Assignee: pSemi Corporation, San Diego, CA (US)

( * ) Notice: Subject to any disclaimer, the term of this patent is extended or adjusted under 35 U.S.C. 154(b) by 113 days.

(21) Appl. No.: 16/276,510

(22) Filed: Feb. 14, 2019

(65) Prior Publication Data

US 2020/0266786 A1  Aug. 20, 2020

(51) Int. Cl.
*H03F 1/26* (2006.01)
*H03F 3/72* (2006.01)
*H03G 1/00* (2006.01)

(52) U.S. Cl.
CPC ............ *H03G 1/0088* (2013.01); *H03F 1/26* (2013.01); *H03F 3/72* (2013.01); *H03F 2200/294* (2013.01); *H03F 2203/7215* (2013.01); *H03F 2203/7221* (2013.01)

(58) Field of Classification Search
CPC ............ H03G 1/0088; H03F 1/26; H03F 3/72
See application file for complete search history.

(56) References Cited

U.S. PATENT DOCUMENTS

| | | | |
|---|---|---|---|
| 4,538,282 A * | 8/1985 | Hochschild | ......... H04L 27/2273 329/307 |
| 9,602,098 B2 | 3/2017 | Prevost | |
| 10,177,715 B1 | 1/2019 | Ayranci et al. | |
| 10,200,067 B1 * | 2/2019 | Adabi | ...................... H03F 3/245 |
| 2004/0021518 A1 * | 2/2004 | Wrathall | ............... H02M 3/156 330/253 |
| 2004/0149939 A1 * | 8/2004 | Dickson | .................... G01P 3/68 250/559.12 |
| 2007/0018720 A1 * | 1/2007 | Wright | ................... H03F 3/602 330/51 |
| 2009/0184864 A1 * | 7/2009 | Barak | ................ H01Q 21/0025 342/175 |
| 2016/0126987 A1 * | 5/2016 | Wloczysiak | ............. H04B 1/18 375/347 |
| 2018/0062622 A1 * | 3/2018 | Yan | .......................... H03F 1/56 |
| 2018/0145648 A1 * | 5/2018 | Ye | ............................. H03F 3/72 |

(Continued)

OTHER PUBLICATIONS

Golat, et al., "Low Noise Amplifier with Tunable Bypass Match", patent application filed in the USPTO on Nov. 27, 2018, U.S. Appl. No. 16/201,777, 42 pgs.

(Continued)

*Primary Examiner* — Patricia T Nguyen
(74) *Attorney, Agent, or Firm* — Jaquez Land Greenhaus & McFarland LLP; Alessandro Steinfl, Esq.

(57) ABSTRACT

In electronic circuits having various gain states, small gain phase shift differences required among various gain states may pose a challenging problem. The disclosed methods and devices provide solution to such challenge. Electronic circuits are described wherein a first path including an amplifier may be bypassed by a second path including only passive elements and for gain states smaller than 0 dB. In such electronic circuits, a phase shifter included in the second path can be adjusted to address the required phase shift among various gain states.

16 Claims, 3 Drawing Sheets

(56) References Cited

U.S. PATENT DOCUMENTS

2020/0014332 A1\* 1/2020 Hageraats ............... H03F 3/193
2020/0036385 A1\* 1/2020 Bushman ............. H03B 5/1231
2020/0227912 A1\* 7/2020 Klaren ...................... H03F 3/19

OTHER PUBLICATIONS

Klaren, Jonathan, "Compact Architecture for Multipath Low Noise Amplifier", patent application filed in the USPTO on Sep. 19, 2018, U.S. Appl. No. 16/135,965, 34 pgs.

\* cited by examiner

LNA WITH CONTROLLED PHASE BYPASS

CROSS-REFERENCE TO RELATED APPLICATIONS

The present application may be related to U.S. Pat. No. 10,177,715 issued Jan. 8, 2019, entitled "Front End Module with Input Match Configurability", to U.S. application Ser. No. 16/201,777, filed Nov. 27, 2018, entitled "Low Noise Amplifier with Tunable Bypass Match", to U.S. Pat. No. 9,602,098 issued Mar. 21, 2017, entitled "RF Switch with Bypass Topology", and to application Ser. No. 16/135,965 filed Sep. 19, 2018, entitled "Compact Architecture for Multipath Low Noise Amplifier", all incorporated herein by reference in their entirety.

SUMMARY

According to a first aspect of the present disclosure, an electronic circuit is provided comprising: a first path and a second path, each connecting an input of the electronic circuit with an output of the electronic circuit; wherein: the first path comprises an amplifier; at least one of the first path or the second path comprises one or more phase shifters; and the second path is configurable to bypass the first path.

According to a second aspect of the present disclosure, an electronic circuit with a plurality of gain states is provided comprising: a serial arrangement of an amplifier and one or more phase shifters; the serial arrangement connecting an input of the electronic circuit with an output of the electronic circuit; and one or more parallel switches coupled each across a corresponding phase shifter of the one or more phase shifters According to a third aspect of the present disclosure, a method of adjusting gain phase shift in an electronic circuit with a plurality of gain states is disclosed, providing: connecting an input of the electronic circuit with an output of the electronic circuit by a first path comprising an amplifier; connecting the input with the output by a second path; including one or more phase shifters in the first path or the second path; in a gain state of the plurality of gain states, configuring the second path to bypass the first path; and adjusting through the one or more phase shifters gain phase shift differences among the plurality of gain states according to a set gain phase shift difference requirement.

DETAILED DESCRIPTION

Figure 1:
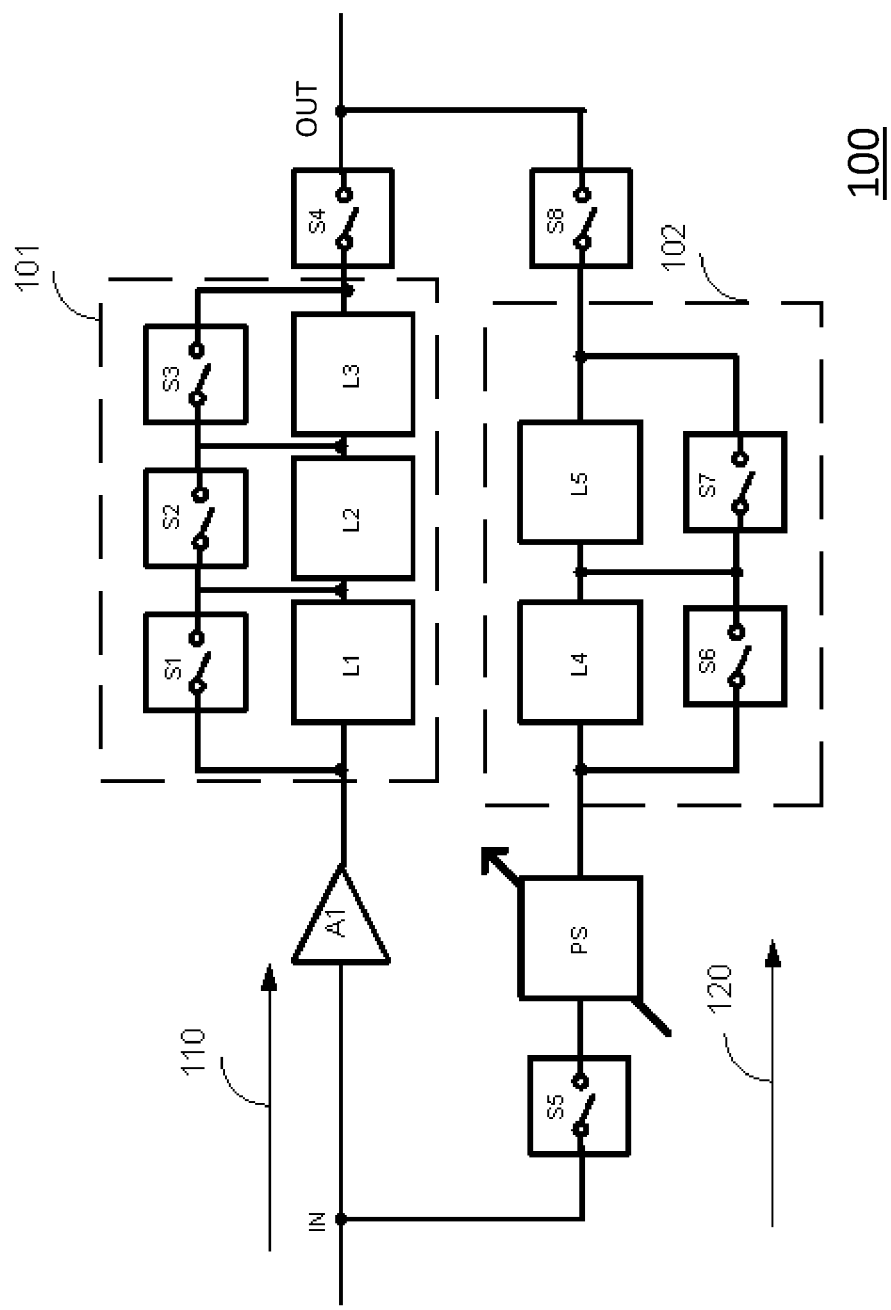
FIG. 1 shows an electronic circuit according to an embodiment of the present disclosure.

FIG. 1 shows an electronic circuit (100) according to an embodiment of the present disclosure. The constituents of the electronic circuit (100) are arranged in a first path and a second path as represented by arrows with numerals (110, 120) respectively, each path starting with the electronic circuit input (IN) and extending to the electronic circuit output (OUT). The first path (110) comprises amplifier (A1), a first electronic block (101) and first path series switch (S4), interconnected serially to one another. The first electronic block (101) comprises first path attenuators (L1, L2, L3) each coupled across a corresponding first path parallel switch of the first path parallel switches (S1, S2, S3). In accordance with embodiments of the present disclosure, amplifier (A1), the first electronic block (101), and the first path series switch (S4) may be connected serially and in any order while connecting electronic circuit input (IN) with electronic circuit output (OUT).

With further reference to FIG. 1, the second path (120) comprises two second path series switches (S5, S8), a variable phase shifter (PS) and a second path electronic block (102), interconnected serially to one another. The second electronic block (102) comprises second path attenuators (L4, L5), each coupled across a corresponding second path parallel switch of second path switches (S6, S7).

Amplifier (A1) may be a low noise amplifier (LNA) with programmable gain states. Depending on the application, the phase shift between gain states may be specified to be within certain ranges, for example, +/−10 degrees. For gain states above 0 dB, the first path (110) may be switched in by closing the first path series switch (S4), and the second path may be switched out by opening second path series switches (S5, S8). In such gain states, the first path parallel switches (S1, S2, S3) may be configured to switch any of the corresponding first path attenuators (L1, L2, L3) in and out, such that the overall gain between electronic circuit input (IN) and the electronic circuit output (OUT) meets set design requirements. For gain states smaller than 0 dB, first path (110) may be switched out by opening first path series switch (S4) and disabling the amplifier, and second path (120) may be switched in by closing second path series switches (S5, S8). In this configuration the amplifier is turned off to effectively disconnect the amp from the second path. As described in the above-incorporated applications and patents, there are many such ways to create amplifier bypass paths. Other examples may include a switch at the input of the first path, before the amplifier. Second path switches (S6, S7) may be configured to switch corresponding second path attenuators (L4, L5) in and out to accommodate gain requirements corresponding to gain states smaller than 0 dB.

The second path (120) acts essentially as a bypass path, bypassing the first path (110) for gain states smaller than 0 dB, as an active element such as an amplifier may no longer be required. Furthermore, in such gain states, variable phase shifter (PS) may be configured to achieve desired gain phase shift differences between various gain states and more in particular between any gain state with a gain smaller than 0 dB and any other gain state with a gain of larger than 0 dB, the gain phase shift difference being set by design specifications. According to an embodiment of the present disclosure the variable phase shifter (PS) may be configured to equalize phase of the first and the second path (110, 120) to within +/−30 degrees. Further embodiments in accordance with the present disclosure may also be envisaged wherein the variable phase shifter (PS) may be configured to equalize phase of the first and the second path (110, 120) to within +/−10 degrees.

The person skilled in the art will appreciate that by virtue of bypassing the first path (110) which includes an active element, e.g. amplifier (A1), the power consumption is improved at gain states smaller than 0 dB. The main reason for such improvement in power consumption is that the second path (120) includes only passive elements, and therefore negligible current is drawn by the second path (120) while operating at gain states smaller than 0 dB. Moreover, bypassing active elements improves also the overall linearity performance of the circuit when such gain states are needed. The person skilled in the art will also appreciate that, by virtue of including the variable phase shifter (PS) in the design, the electronic circuit (100) can also be used in applications wherein a tighter range of phase shift difference among various gain states is required due to more stringent design specifications. According to an embodiment of the present disclosure, a variable phase shifter is not required. In some instances a fixed phase shift may be used to compensate for phase differences between the first and second path. A variable phase shifter offers the benefit of being able to compensate for phase differences between paths, gain/attenuation states, frequency, tolerance, and other variables that may lead to undesired phase responses.

Figure 2:
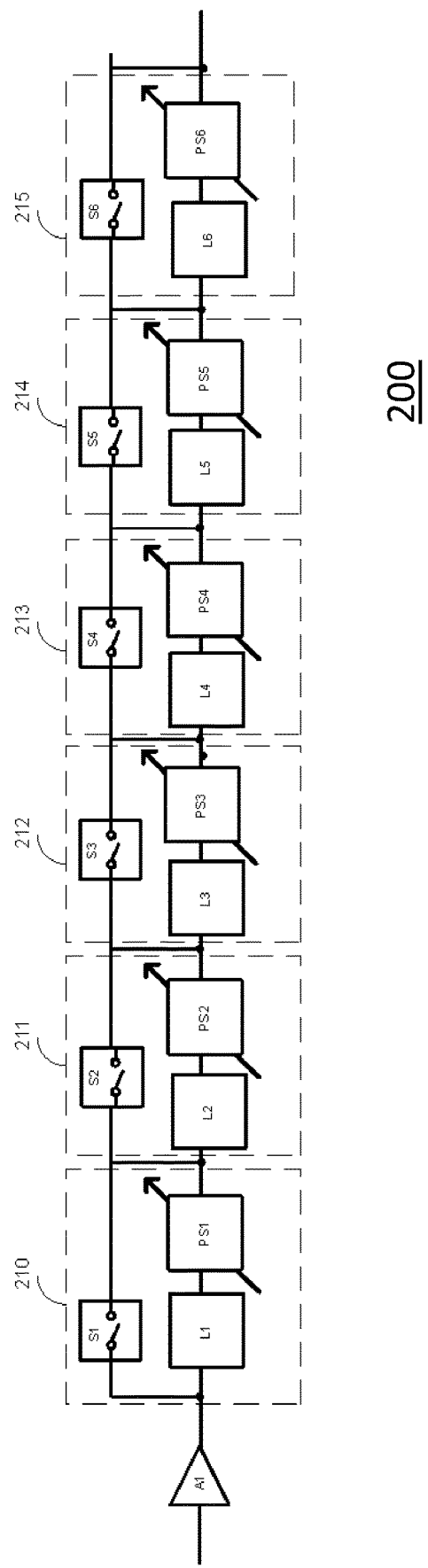
FIG. 2 shows an electronic circuit according to another embodiment of the present disclosure.

FIG. 2 shows an electronic circuit (200) in accordance with further embodiments of the present disclosure. The electronic circuit (200) comprises amplifier (A1) connected in series with electronic blocks (210, 211, . . . , 215) comprising each a series combination of an attenuator and a phase shifter, and a parallel switch coupled across such series combination. For example, the electronic element (210) comprises attenuator (L1) connected in series with corresponding phase shifter (PS1) and parallel switch (S1) coupled across the series combination of attenuator (L1) and phase shifter (PS1).

With further reference to FIG. 2, and according to embodiments of the present disclosure, amplifier (A1) may be an LNA with programmable gain states. Depending on phase shift requirements among various gain states, switches (S1, . . . , S5) may be configured to switch in and out their corresponding series combination of attenuators and phase shifters. Moreover, and again depending on phase shift requirements, phase shifters (PS1, . . . , PS5) may be configured to provide different phase shift values. According to further embodiments of the present disclosure, the electronic circuit (200) may comprise one or more electronic elements.

Figure 3:
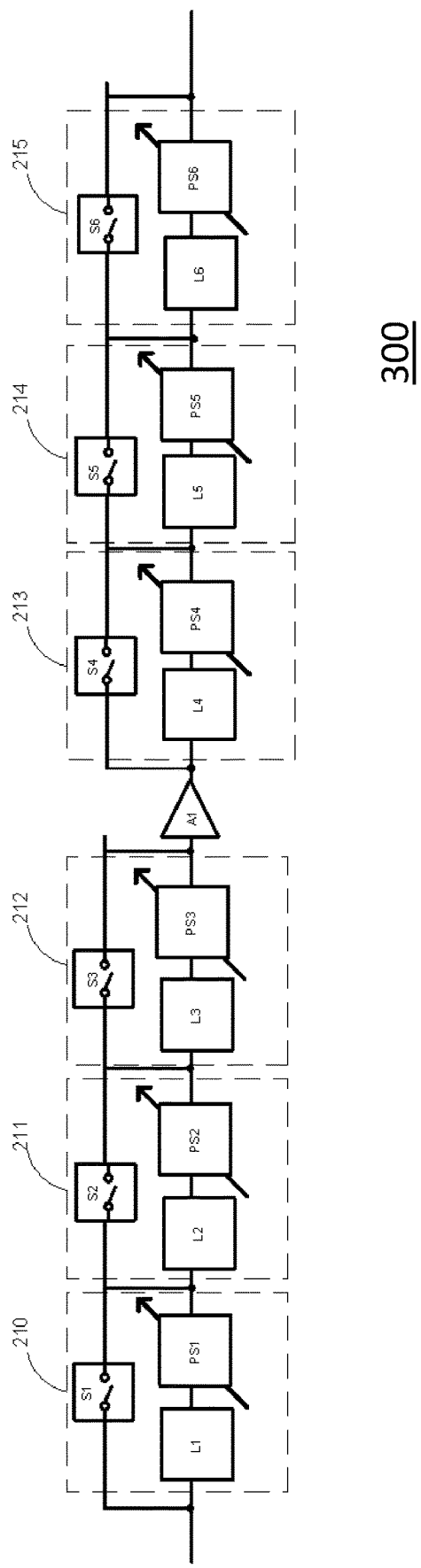
FIG. 3 shows an electronic circuit according to a further embodiment of the present disclosure.

FIG. 3 shows another electronic circuit (300) according to further embodiments of the present disclosure. The principle of operation of the electronic circuit (300) is similar to what was described with regards to the electronic circuit (200) of FIG. 2, except that one or more of electronic elements, (e.g., 210, 211, 212) are arranged at the input of the amplifier and not all the electronic elements are placed at the output of the amplifier. As a result of such arrangement, the linearity is improved at the expense of the noise figure (NF). According to an embodiment of the present disclosure, one or more electronic elements may be arranged at the amplifier input and one or more electronic elements may be arranged at the amplifier output. Embodiments in accordance with the present disclosure may also be envisaged wherein all the electronic elements are arranged at the amplifier input It is to be understood that the foregoing description is intended to illustrate and not to limit the scope of the invention, which is defined by the scope of the following claims, and that other embodiments are within the scope of the claims. Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence.

What is claimed is:

1. An electronic circuit comprising:
    a first path and a second path, each connecting a signal input of the electronic circuit with a signal output of the electronic circuit such that the first path and the second path connect to the same signal input;
    wherein:
        the first path comprises an amplifier;
        at least one of the first path or the second path comprises one or more adjustable variable phase shifters configured to achieve desired gain phase shift differences between various gain states of the electronic circuit; and
        the second path is configurable to bypass the first path.

2. The electronic circuit of claim 1, wherein the set gain phase shift difference requirement is such that the phase shift difference lies within +/−30 degrees.

3. The electronic circuit of claim 1, wherein the set gain phase shift difference requirement is such that the phase shift difference lies within +/−10 degrees.

4. The electronic circuit of claim 1, wherein at least one of the first or the second path comprises one or more attenuators.

5. The electronic circuit of claim 4, further comprising one or more parallel switches each coupling across a corresponding attenuator of the one or more attenuators.

6. The electronic circuit of claim 5, wherein each of the first and the second path comprises series switches used to switch in or switch out the first or the second path.

7. The electronic circuit of claim 6, wherein the plurality of gain states comprise a first gain state and a second gain state and wherein:
    in the first gain state, an overall gain between the signal input and the signal output is larger than 0 dB; and
    in the second gain state, the overall gain between the signal input and the signal output is smaller than 0 dB.

8. The electronic circuit of claim 7, wherein the overall gain between the signal input and the signal output is adjusted by switching the one or more attenuators in and out using the one or more parallel switches.

9. An electronic circuit with a plurality of gain states, comprising:
    a serial arrangement of an amplifier and one or more adjustable variable phase shifters; the serial arrangement connecting a signal input of the electronic circuit with a signal output of the electronic circuit such that the first path and the second path connect to the same signal input; and
    one or more parallel switches coupled each across a corresponding adjustable variable phase shifter of the one or more variable phase shifters configured to achieve desired gain phase shift differences between various gain states of the electronic circuit.

10. The electronic circuit of claim 9, further comprising one or more attenuators, and wherein in each gain state, the overall gain between the signal input and the signal output is adjusted by switching the one or more attenuators in or out and using the one or more parallel switches.

11. The electronic circuit of claim 9, wherein the set gain phase shift difference requirement is such that the phase shift difference lies within +/−30 degrees.

12. The electronic circuit of claim 9, wherein the set gain phase shift difference requirement is such that the phase shift difference lies within +/−10 degrees.

13. A method of adjusting gain phase shift in an electronic circuit with a plurality of gain states comprising:
    connecting a signal input of the electronic circuit with a signal output of the electronic circuit by a first path comprising an amplifier;
    connecting the signal input with the signal output by a second path;

including one or more adjustable variable phase shifters in the first path or the second path;

in a gain state of the plurality of gain states, configuring the second path to bypass the first path; and adjusting through the one or more adjustable variable phase shifters gain phase shift differences among the plurality of gain states according to a set gain phase shift difference requirement.

14. The method of claim 13, wherein at least one of the first or the second path comprises one or more attenuators.

15. The method of claim 14, further comprising selectively switching in and out the one or more attenuators to adjust an overall gain between the signal input and the signal output.

16. The method of claim 15, wherein the set gain phase shift difference requirement is such that the phase shift difference lies within +/−10 degrees.

* * * * *